(12) United States Patent
Takeuchi et al.

(10) Patent No.: US 9,818,860 B2
(45) Date of Patent: Nov. 14, 2017

(54) SILICON CARBIDE SEMICONDUCTOR DEVICE AND METHOD FOR PRODUCING THE SAME

(71) Applicants: DENSO CORPORATION, Kariya, Aichi-pref. (JP); TOYOTA JIDOSHA KABUSHIKI KAISHA, Toyota-shi, Aichi-ken (JP); Masahiro Sugimoto, Toyota-shi, Aichi-ken (JP); Hidefumi Takaya, Toyota-shi, Aichi-ken (JP); Akitaka Soeno, Toyota-shi, Aichi-ken (JP); Jun Morimoto, Toyota-shi, Aichi-ken (JP)

(72) Inventors: Yuichi Takeuchi, Obu (JP); Naohiro Suzuki, Anjo (JP); Masahiro Sugimoto, Toyota (JP); Hidefumi Takaya, Miyoshi (JP); Akitaka Soeno, Toyota (JP); Jun Morimoto, Nisshin (JP); Narumasa Soejima, Seto (JP); Yukihiko Watanabe, Nagoya (JP)

(73) Assignees: DENSO CORPORATION, Kariya (JP); TOYOTA JIDOSHA KABUSHIKI KAISHA, Toyota-shi (JP)

( * ) Notice: Subject to any disclaimer, the term of this patent is extended or adjusted under 35 U.S.C. 154(b) by 0 days.

(21) Appl. No.: 15/365,150

(22) Filed: Nov. 30, 2016

(65) Prior Publication Data
US 2017/0084735 A1 Mar. 23, 2017

Related U.S. Application Data

(62) Division of application No. 14/400,365, filed as application No. PCT/JP2013/003545 on Jun. 6, 2013, now Pat. No. 9,543,428.

(30) Foreign Application Priority Data

Jun. 13, 2012 (JP) .................................. 2012-134031
Mar. 12, 2013 (JP) .................................. 2013-049229

(51) Int. Cl.
*H01L 29/78* (2006.01)
*H01L 29/16* (2006.01)
(Continued)

(52) U.S. Cl.
CPC ........ *H01L 29/7811* (2013.01); *H01L 21/046* (2013.01); *H01L 21/0475* (2013.01);
(Continued)

(58) Field of Classification Search
CPC ............. H01L 29/7811; H01L 29/4236; H01L 29/872; H01L 29/66734; H01L 29/66068;
(Continued)

(56) References Cited

U.S. PATENT DOCUMENTS 6,184,545 B1  2/2001 Werner et al.
7,642,597 B2  1/2010 Saito
(Continued)

FOREIGN PATENT DOCUMENTS

DE  10312911 A1  10/2004
JP  H06-151867 A  5/1994
(Continued)

OTHER PUBLICATIONS

International Search Report and Written Opinion of the International Searching Authority dated Sep. 3, 2013 for the corresponding international application No. PCT/JP2013/003545 in connection with related U.S. Appl. No. 14/400,365 (and English translation).
(Continued)

*Primary Examiner* — Matthew Reames
*Assistant Examiner* — Vincent Wall
(74) *Attorney, Agent, or Firm* — Posz Law Group, PLC

(57) ABSTRACT

An SiC semiconductor device has a p type region including a low concentration region and a high concentration region
(Continued)

filled in a trench formed in a cell region. A p type column is provided by the low concentration region, and a p+ type deep layer is provided by the high concentration region. Thus, since a SJ structure can be made by the p type column and the n type column provided by the n type drift layer, an on-state resistance can be reduced. As a drain potential can be blocked by the p+ type deep layer, at turnoff, an electric field applied to the gate insulation film can be alleviated and thus breakage of the gate insulation film can be restricted. Therefore, the SiC semiconductor device can realize the reduction of the on-state resistance and the restriction of breakage of the gate insulation film.

6 Claims, 13 Drawing Sheets

(51) Int. Cl.
| | |
|---|---|
| *H01L 21/82* | (2006.01) |
| *H01L 29/417* | (2006.01) |
| *H01L 29/66* | (2006.01) |
| *H01L 29/10* | (2006.01) |
| *H01L 29/872* | (2006.01) |
| *H01L 21/04* | (2006.01) |
| *H01L 21/306* | (2006.01) |
| *H01L 21/308* | (2006.01) |
| *H01L 29/423* | (2006.01) |
| *H01L 21/761* | (2006.01) |
| *H01L 29/15* | (2006.01) |
| *H01L 29/06* | (2006.01) |
| *H01L 29/08* | (2006.01) |
| *H01L 29/861* | (2006.01) |

(52) U.S. Cl.
CPC ...... *H01L 21/308* (2013.01); *H01L 21/30604* (2013.01); *H01L 21/761* (2013.01); *H01L 21/8213* (2013.01); *H01L 29/0634* (2013.01); *H01L 29/0661* (2013.01); *H01L 29/0696* (2013.01); *H01L 29/1095* (2013.01); *H01L 29/157* (2013.01); *H01L 29/158* (2013.01); *H01L 29/1608* (2013.01); *H01L 29/41766* (2013.01); *H01L 29/4236* (2013.01); *H01L 29/66068* (2013.01); *H01L 29/66727* (2013.01); *H01L 29/66734* (2013.01); *H01L 29/7806* (2013.01); *H01L 29/7813* (2013.01); *H01L 29/872* (2013.01); *H01L 29/063* (2013.01); *H01L 29/0615* (2013.01); *H01L 29/0878* (2013.01); *H01L 29/861* (2013.01)

(58) Field of Classification Search
CPC ............ H01L 29/0696; H01L 29/1095; H01L 29/0661; H01L 29/7806; H01L 29/7813; H01L 29/0634; H01L 29/66727; H01L 29/1608; H01L 29/158; H01L 29/157; H01L 21/761
See application file for complete search history.

(56) References Cited

U.S. PATENT DOCUMENTS

| | | |
|---|---|---|
| 8,673,700 B2 | 3/2014 | Yedinak et al. |
| 2003/0040144 A1 | 2/2003 | Blanchard et al. |
| 2003/0222327 A1 | 12/2003 | Yamaguchi et al. |
| 2003/0224588 A1 | 12/2003 | Yamauchi et al. |
| 2005/0221547 A1 | 10/2005 | Yamauchi et al. |
| 2006/0043478 A1 | 3/2006 | Yamaguchi et al. |
| 2008/0001223 A1 | 1/2008 | Saggio et al. |
| 2008/0038850 A1 | 2/2008 | Yamaguchi et al. |
| 2008/0102582 A1 | 5/2008 | Takei |
| 2008/0135929 A1 | 6/2008 | Saito et al. |
| 2009/0114969 A1 | 5/2009 | Suzuki et al. |
| 2009/0200559 A1 | 8/2009 | Suzuki et al. |
| 2010/0044788 A1 | 2/2010 | Hirler et al. |
| 2010/0093136 A1 | 4/2010 | Saggio et al. |
| 2010/0096692 A1 | 4/2010 | Saito et al. |
| 2012/0007173 A1 | 1/2012 | Yamamoto et al. |
| 2012/0032312 A1 | 2/2012 | Nogami et al. |
| 2012/0112306 A1 | 5/2012 | Onishi |
| 2013/0026560 A1 | 1/2013 | Onishi et al. |

FOREIGN PATENT DOCUMENTS

| | | |
|---|---|---|
| JP | 2004-241768 A | 8/2004 |
| JP | 2006-351713 A | 12/2006 |
| JP | 2009-302091 A | 12/2009 |
| JP | 2010-239160 A | 10/2010 |
| JP | 2012-064660 A | 3/2012 |

OTHER PUBLICATIONS

Office Action dated Nov. 30, 2015 by the Korean Intellectual Property Office in the corresponding Korean application No. 10-2014-7034763 in connection with related U.S. Appl. No. 14/400,365 (and English translation).

Extended European Search Report dated Feb. 15, 2016 by the European Patent Office in corresponding EP application No. 13804906.9 in connection with related U.S. Appl. No. 14/400,365.

Office Action dated Jun. 2, 2015 by the Japanese Patent Office in corresponding JP patent application No. 2013-049229 in connection with related U.S. Appl. No. 14/400,365 (and English translation).

SILICON CARBIDE SEMICONDUCTOR DEVICE AND METHOD FOR PRODUCING THE SAME

CROSS REFERENCE TO RELATED APPLICATIONS

This application is a divisional application of U.S. utility application Ser. No. 14/400,365 filed on Nov. 11, 2014, which is a U.S. national stage application of PCT/JP2013/003545 filed on Jun. 6, 2013 and is based on Japanese Patent Applications No. 2012-134031 filed on Jun. 13, 2012 and No. 2013-49229 filed on Mar. 12, 2013, the disclosures of which are incorporated herein by reference.

TECHNICAL FIELD

The present disclosure relates to a silicon carbide (hereinafter referred to as SiC) semiconductor device having a switching element with a trench gate structure, and a method for producing the same.

BACKGROUND ART

Conventionally, a patent literature 1 has proposed an SiC semiconductor device that aims to restrict breakage of a gate insulation film in a MOSFET with a trench gate structure and to improve surge withstand (avalanche resistance) of the element. Specifically, a p$^+$ type deep layer is provided to a position lower than the bottom surface of the trench, between trench gate structures, and is further deepened at a middle of a cell region. By forming the p$^+$ type layer in this manner, concentration of an electric field at the bottom of the trench, when the MOSFET is turned off, is alleviated, and breakage of the gate insulation film is restricted. Further, since the p$^+$ type deep layer is further deepened at the middle of the cell region, the surge withstand of the element is increased.

Also, a patent literature 2 has conventionally proposed a Si semiconductor device that enables reduction of an on-state resistance in a MOSFET with a trench gate structure. Specifically, the Si semiconductor device has a super junction (hereinafter referred to as the SJ) structure in which n type columns for forming n type drift layers and p type columns are alternately arranged, under the trench gate structure. Since the SJ structure is provided in this manner, when the MOSFET is turned off, an electric field is evenly applied in the SJ to reduce the concentration of electric field. When the MOSFET is turned on, since a current path passing through the SJ structure is formed, the on-state resistance can be reduced.

PRIOR ART LITERATURES

Patent Literatures

Patent Literature: JP 2009-302091 A
Patent Literature: JP 2004-241768 A

SUMMARY OF INVENTION

However, even in a structure of having a p$^+$ type deep layer, as indicated in the patent literature 1, it is desirable to further reduce the on-state resistance. Further, as indicated in the patent literature 2, the SJ structure employed to the Si semiconductor device can also be employed to the SiC semiconductor device. However, a breakdown electric field intensity of the SiC is greatly higher than that of the Si. Therefore, the intensity of electric field applied to the gate insulation film, when the element is turned off, is high, resulting in breakage of the gate insulation film.

The present disclosure is made in view of the foregoing issues, and it is an object of the present disclosure to provide an SiC semiconductor device and a method for producing the SiC semiconductor device, which is capable of realizing both of reduction of the on-state resistance and restriction of breakage of the gate insulation film.

According to a first aspect of the present disclosure, an SiC semiconductor device has a trench gate structure including a gate insulation film and a gate electrode formed within a first trench that extends from a surface of a source region to a position deeper than a base region. In the SiC semiconductor device, a second conductivity type region including a second conductivity type first low concentration region and a second conductivity type first high concentration region are formed within a second trench that is deeper than the first trench. The first low concentration region has a second conductivity type impurity concentration being relatively low. The high concentration region is formed on a surface of the first low concentration region, and has a second conductivity type impurity concentration being relatively higher than that of the first low concentration region. The first high concentration region provides a deep layer as being formed deeper than the first low concentration region. The SiC semiconductor device has a super junction structure including alternately arranged P and N columns which are provided by the first low concentration region and a portion of the drift layer opposed to the first low concentration region, as a structure of electrically connecting the base region to a source electrode through the source region and the second conductivity type region.

As described above, the SiC semiconductor device has the structure provided with the second conductivity type region including the first low concentration region and the first high concentration region filled in the second trench. As such, a second conductivity type column can be provided by the first low concentration region, and the deep layer can be provided by the first high concentration region.

Therefore, since the SJ structure can be provided by the low concentration region, the drift layer, and the P and N columns, the on-state resistance can be reduced. Also, a drain potential can be blocked by the deep layer provided by the high concentration region, when the element is turned off. Therefore, an electric field applied to the gate insulation film can be alleviated, and breakage of the gate insulation film can be restricted. Accordingly, the SiC semiconductor device can realize both of the reduction of the on-state resistance and the restriction of the breakage of the gate insulation film.

According to a second aspect of the present disclosure, a region where a semiconductor switching element is formed is referred to as a cell region, and the SiC semiconductor device has an outer peripheral withstand voltage structure in an outer peripheral region surrounding a periphery of the cell region. The outer peripheral withstand voltage structure is an impurity embedded layer having a second conductivity type second low concentration region disposed in a third trench. The second low concentration region has a second conductivity type impurity concentration being equal to that of the first low concentration region. The third trench is formed at a part of the drift layer exposed in a recessed portion of the outer peripheral region, the recessed portion being formed by removing the source region and the base region. The third trench extends from the surface of the drift layer.

As described above, also in the outer peripheral region, the impurity embedded layer having the similar structure to the second conductivity type region of the cell region is provided, and this impurity embedded layer is filled in the third trench. Therefore, the impurity embedded layer can achieve a function of a guard ring. Further, since this impurity embedded layer can be formed simultaneously with the second conductivity region of the cell region, these production steps can be shared, and thus a production process can be simplified.

According to a third aspect of the present disclosure, a method for producing an SiC semiconductor device with a semiconductor switching element includes the steps of: preparing a semiconductor substrate in which a drift layer is formed on a main surface of a silicon carbide substrate, a base region is formed on the drift layer, and a source region is further formed on the base region; forming a second trench by performing etching using a mask having an opening at a position corresponding to a region of the semiconductor substrate where the second trench is to be formed; epitaxially growing, in the second trench, a second conductivity type first layer having a second conductivity type impurity concentration being relatively low and a second conductivity type second layer having a second conductivity type impurity concentration being higher than that of the first layer; and partially removing the first layer and the second layer to expose the source region, thereby providing a first low concentration region and a first high concentration region by the first layer and the second layer remaining in the second trench.

As described above, the first low concentration region and the first high concentration region are provided by filling the first layer and the second layer having different impurity concentrations in the same second trench. Therefore, a production process can be simplified, as compared with a case where the first low concentration region for providing the second conductivity type column and the first high concentration region for providing the deep layer are separately formed by independent steps.

According to a fourth aspect of the present disclosure, in the method for producing the SiC semiconductor device having the semiconductor switching element, a region where the semiconductor switching element is formed is referred to as a cell region. To form an outer peripheral withstand voltage structure in an outer peripheral region surrounding a periphery of the cell region, a step of forming the third trench in the outer peripheral region is performed simultaneously with the step of forming the second trench. A step of forming the first layer and the second layer in the third trench is performed simultaneously with the step of forming the first layer and the second layer in the second trench. Simultaneously with the step of partially removing the first layer and the second layer to form the first low concentration region and the first high concentration region, a step of forming the impurity embedded region is performed to form the second conductivity type second low concentration region having the second conductivity type impurity concentration equal to that of the first low concentration region by the first layer remaining in the third trench, and to form the second conductivity type second high impurity region having the second conductivity type impurity concentration being higher than that of the second low concentration region and being deeper than the first trench by the second layer. Thereafter, a step of forming a recessed portion in a region of the outer peripheral region where the impurity embedded region is formed to expose the drift layer at the region where the recessed portion is formed.

As described above, the outer peripheral withstand voltage structure provided in the outer peripheral region can be made of the impurity embedded region, and the step of forming the second low concentration region and the second high concentration region providing the impurity embedded region can be shared with the step of forming the first low concentration region and the first high concentration region providing the second conductivity region in the cell region. Therefore, the production process can be simplified.

BRIEF DESCRIPTION OF DRAWINGS

The above and other objects, features and advantages of the present disclosure will become more apparent from the following detailed description made with reference to the accompanying drawings, in which.

Figure 1:
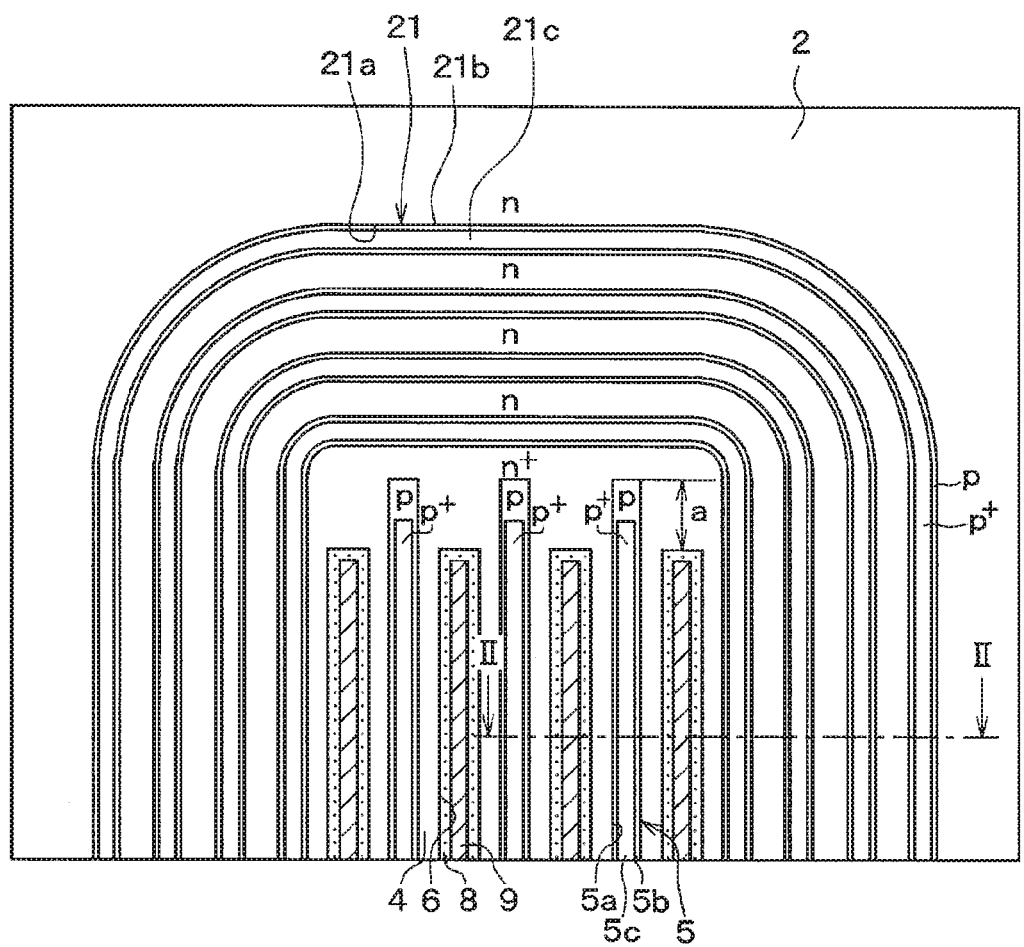
FIG. 1 is a diagram illustrating an upper layout of an SiC semiconductor device having a MOSFET with an inversion type trench gate structure according to a first embodiment of the present disclosure.
Figure 3:
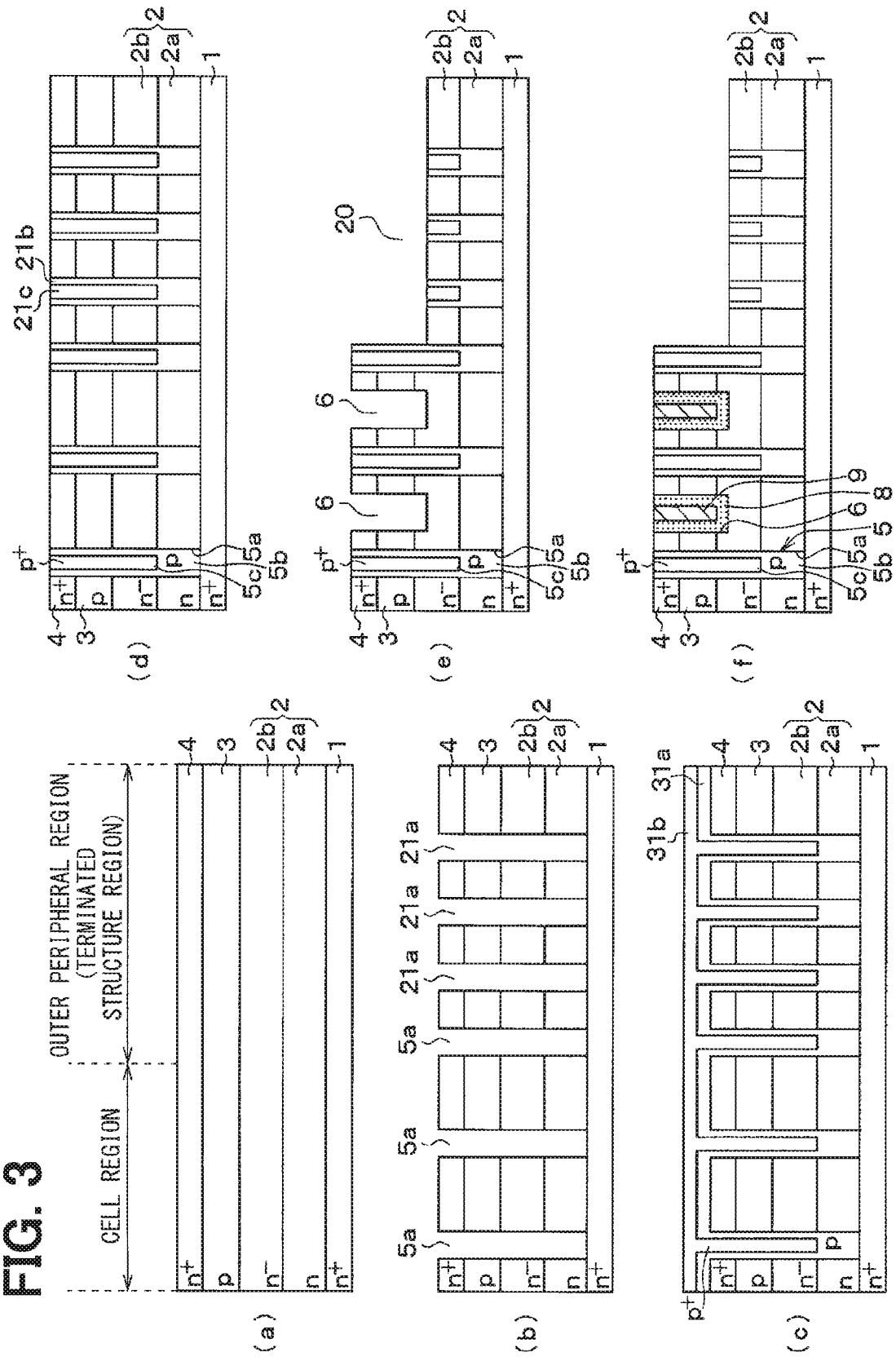
Figure 4:
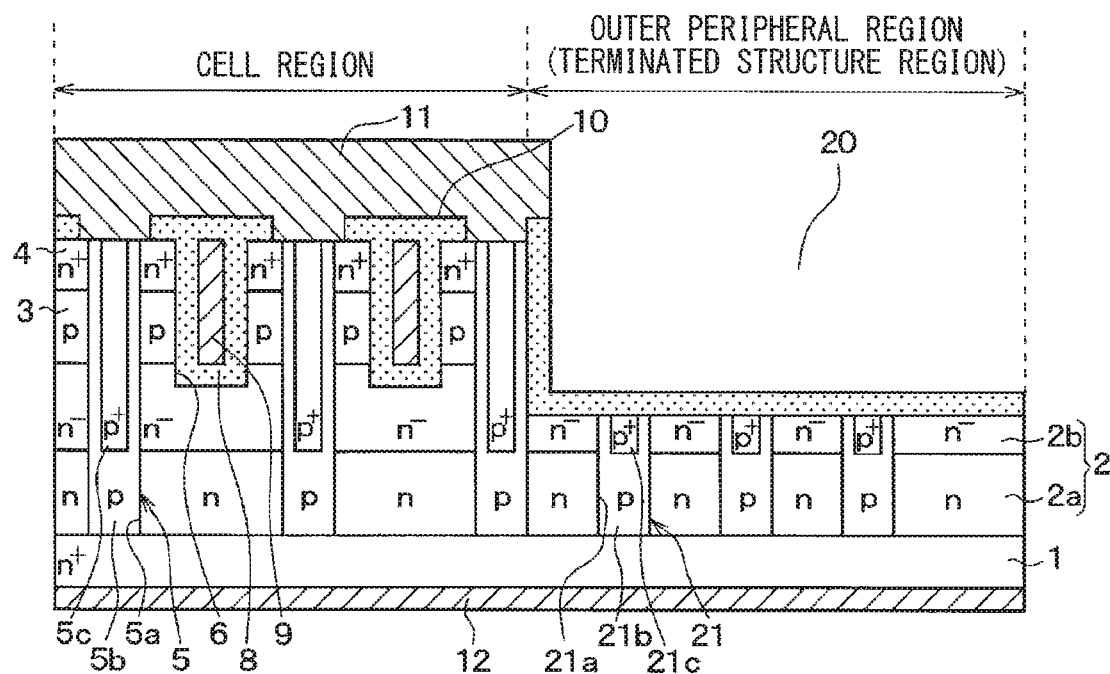
Figure 5:
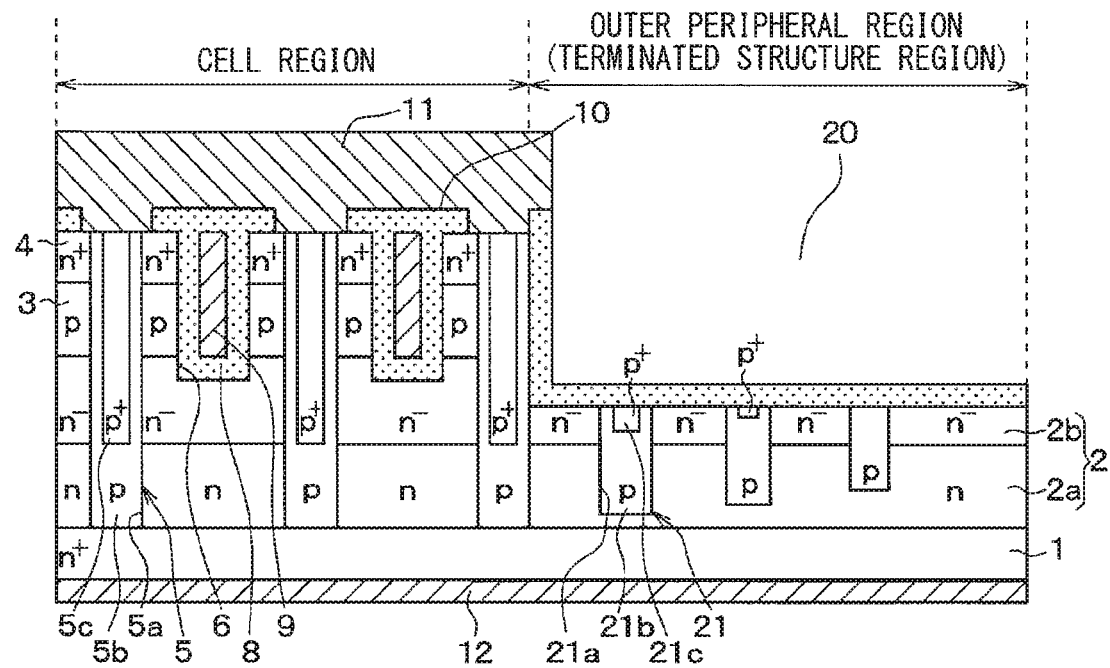
Figure 6:
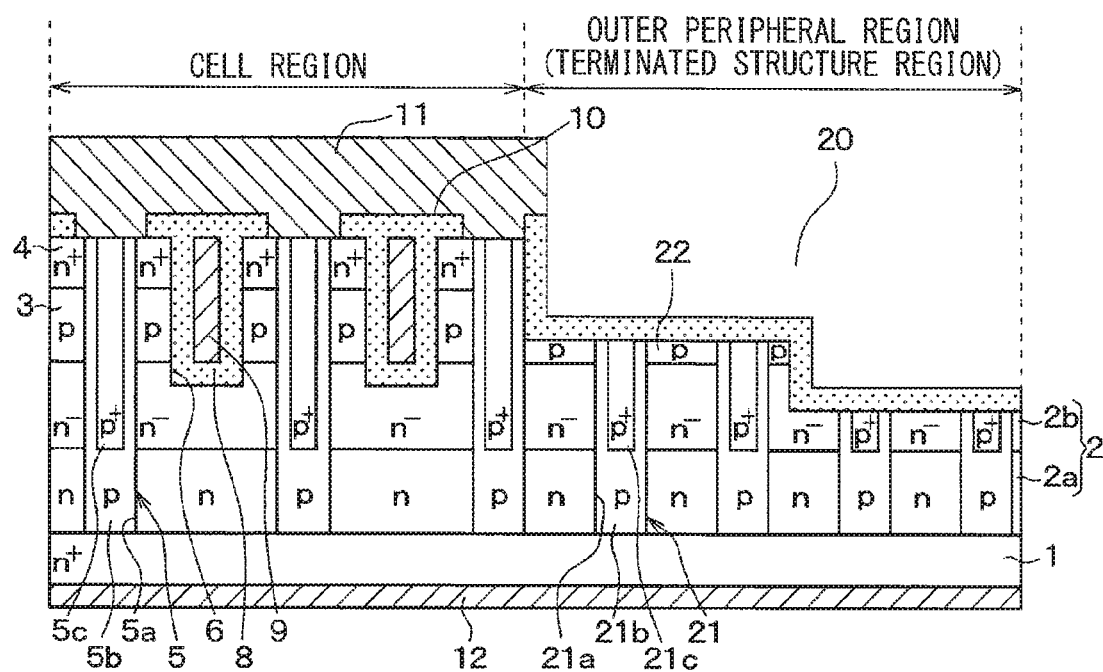
Figure 7:
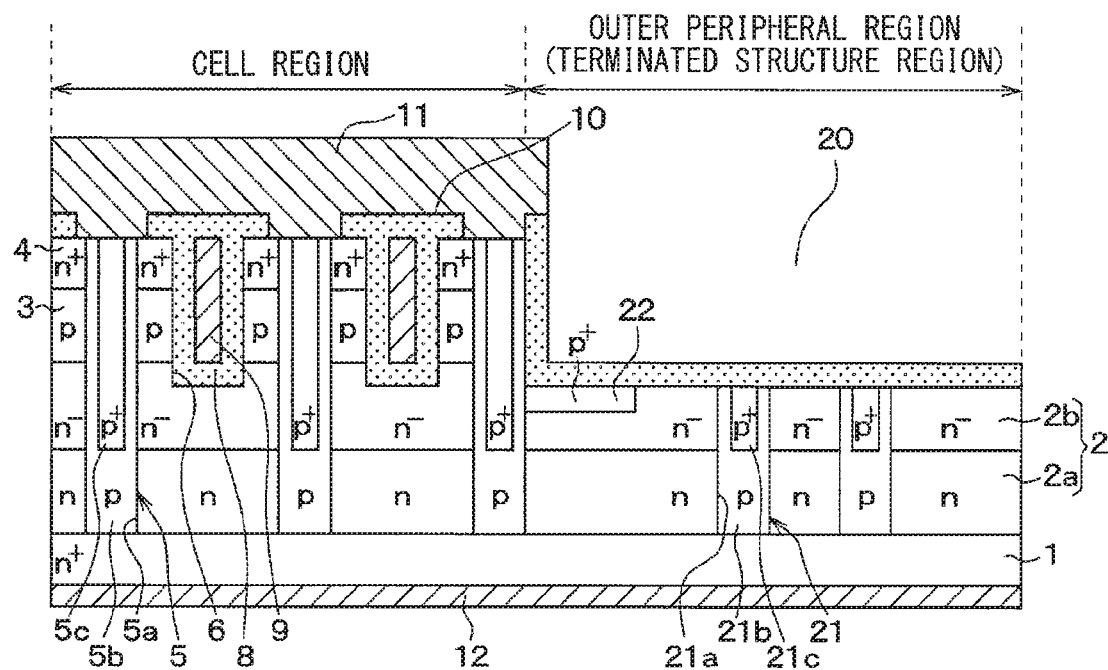
Figure 8:
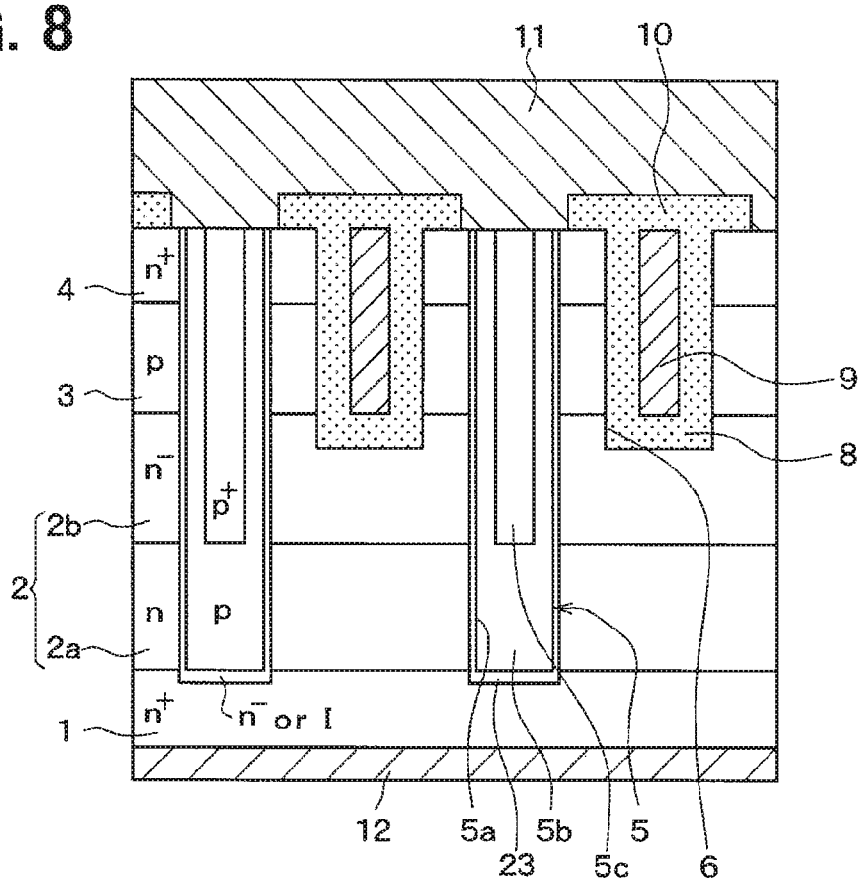
Figure 9:
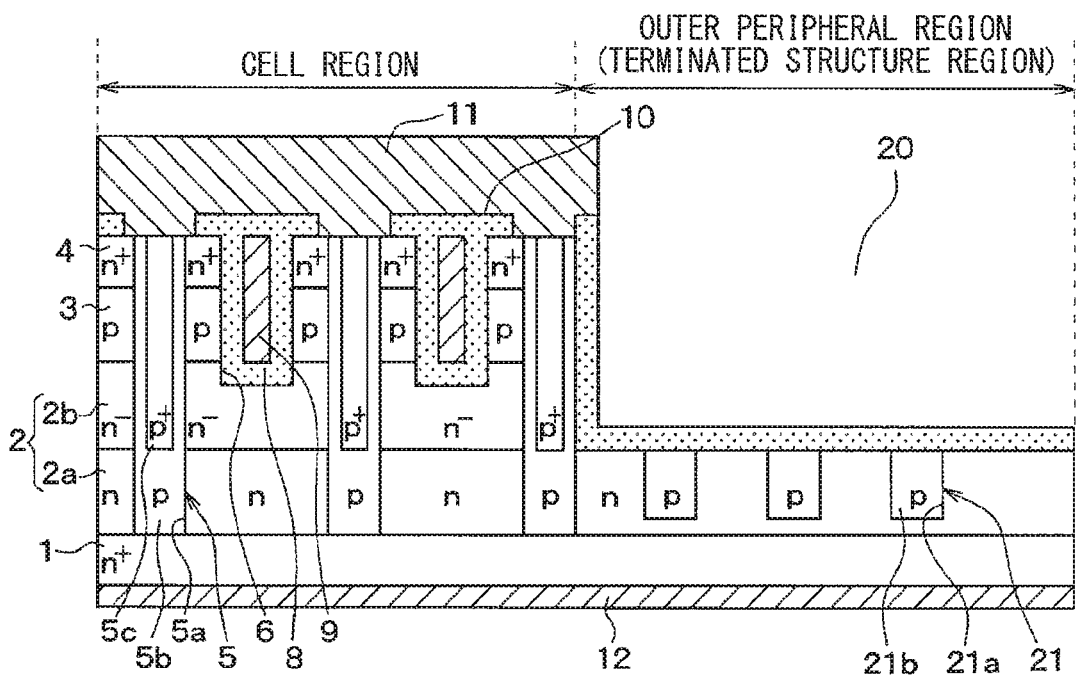
Figure 10:
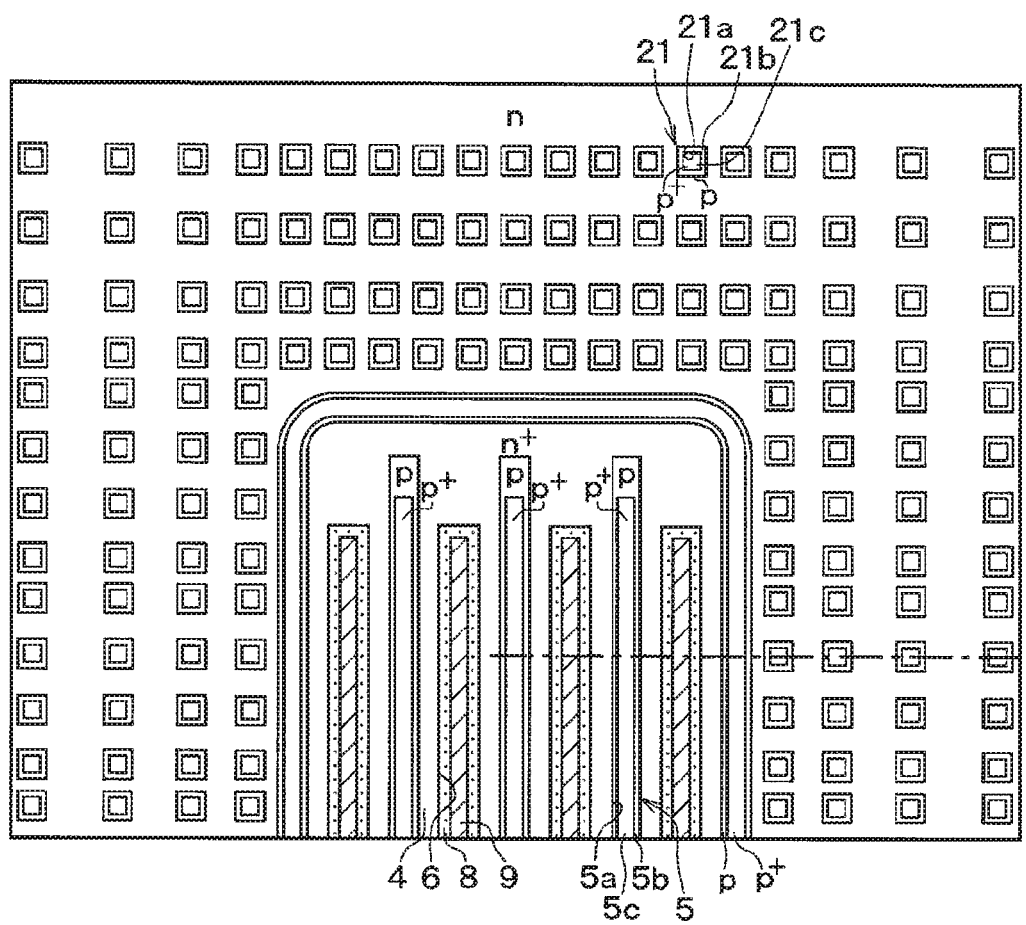
Figure 11:
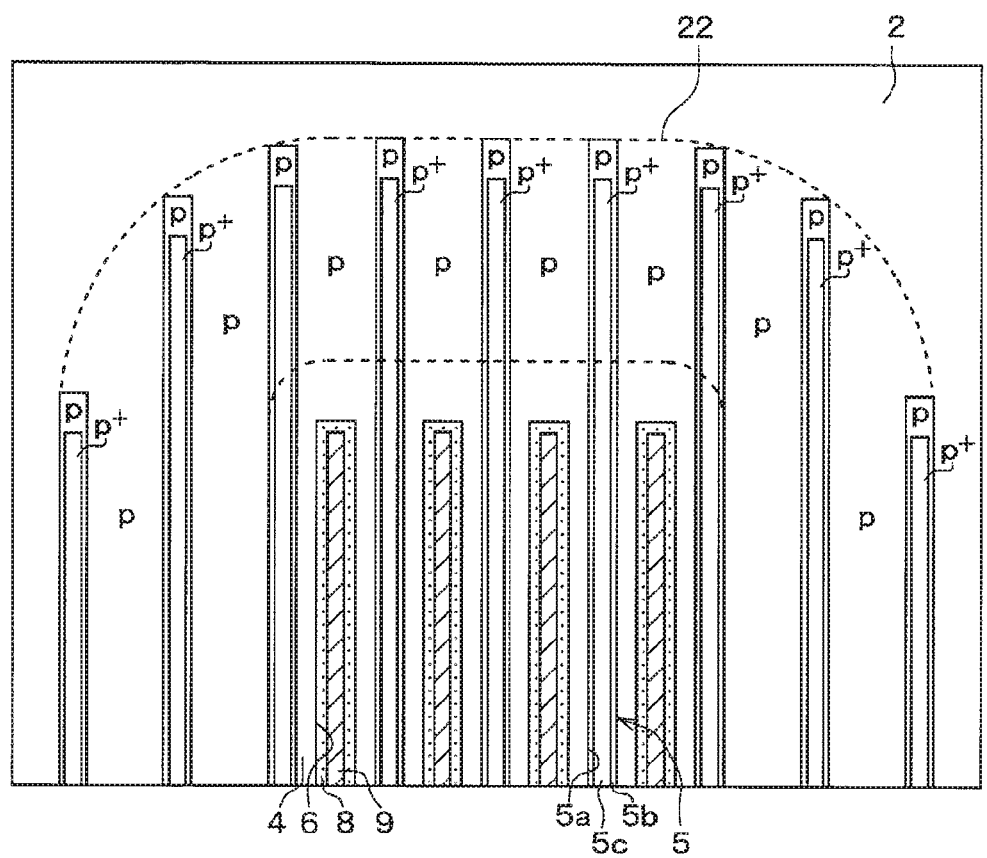
Figure 12:
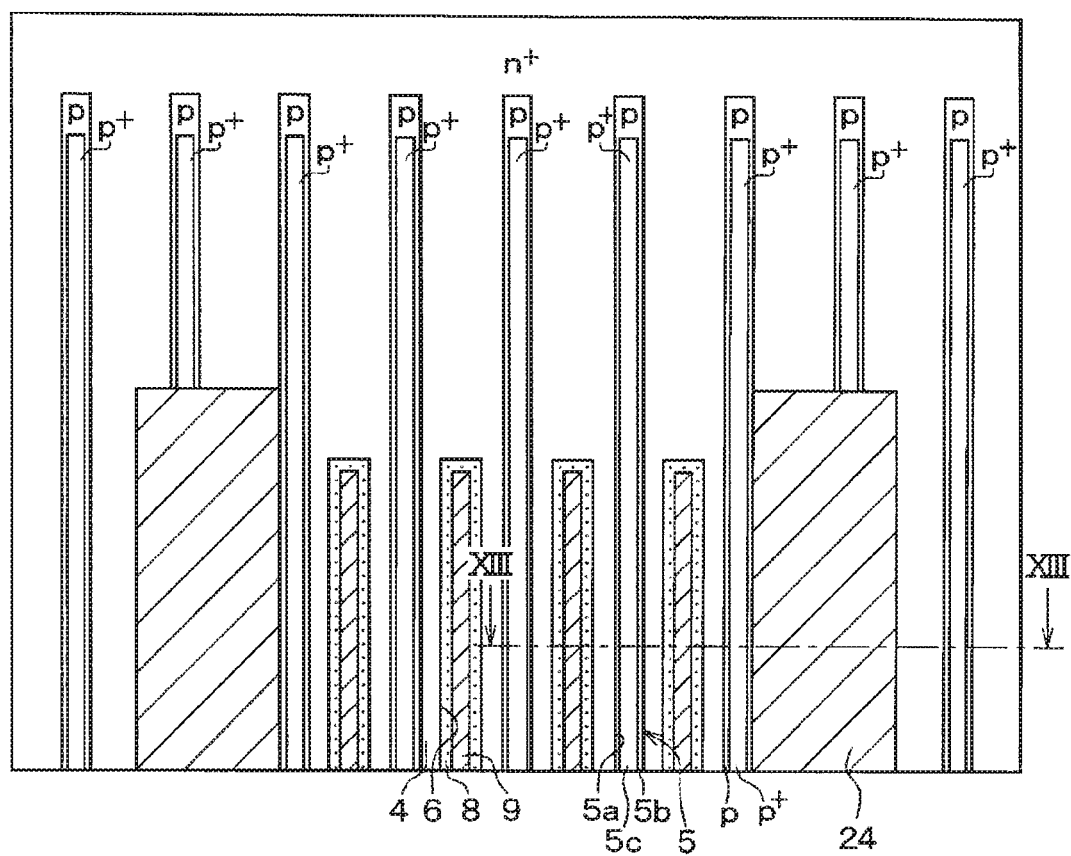
Figure 13:
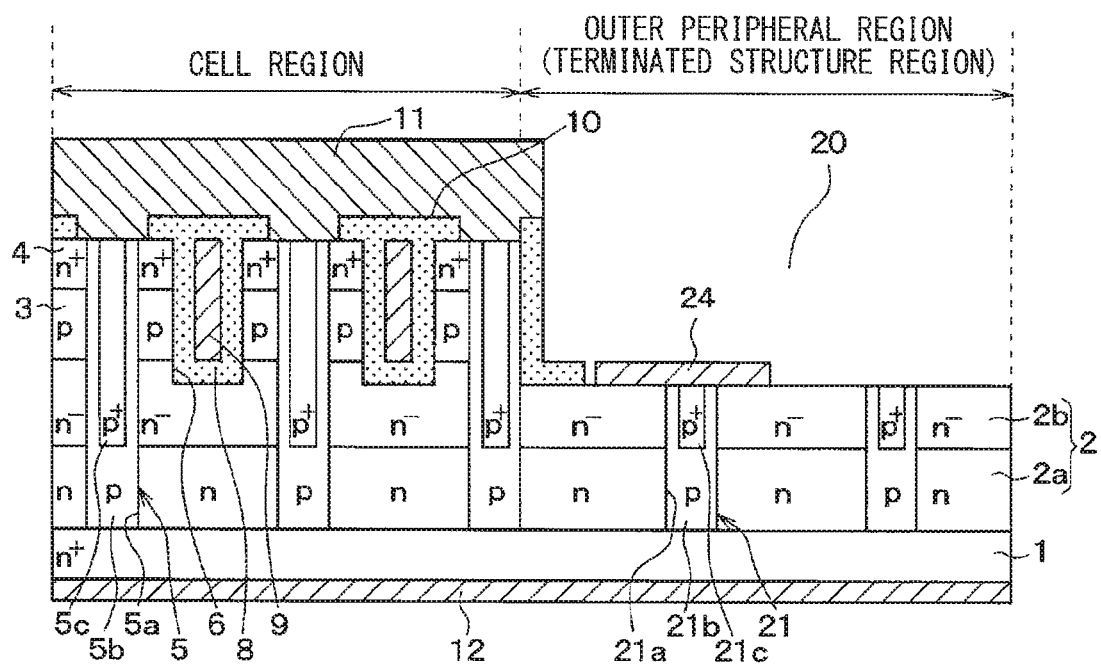
Figure 14:
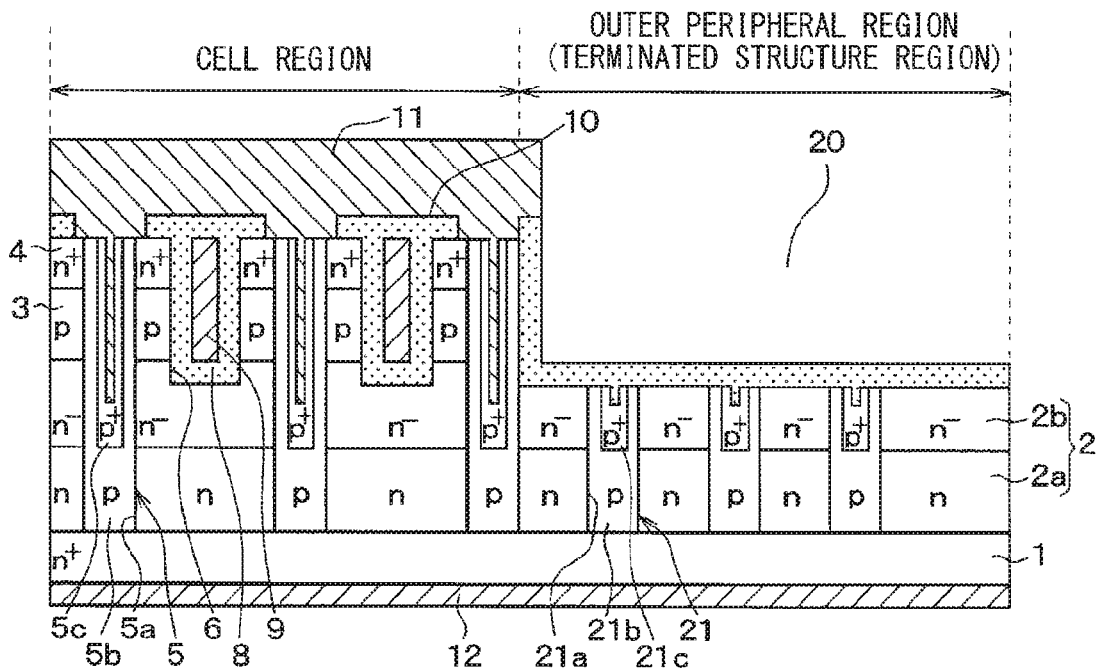
Figure 15:
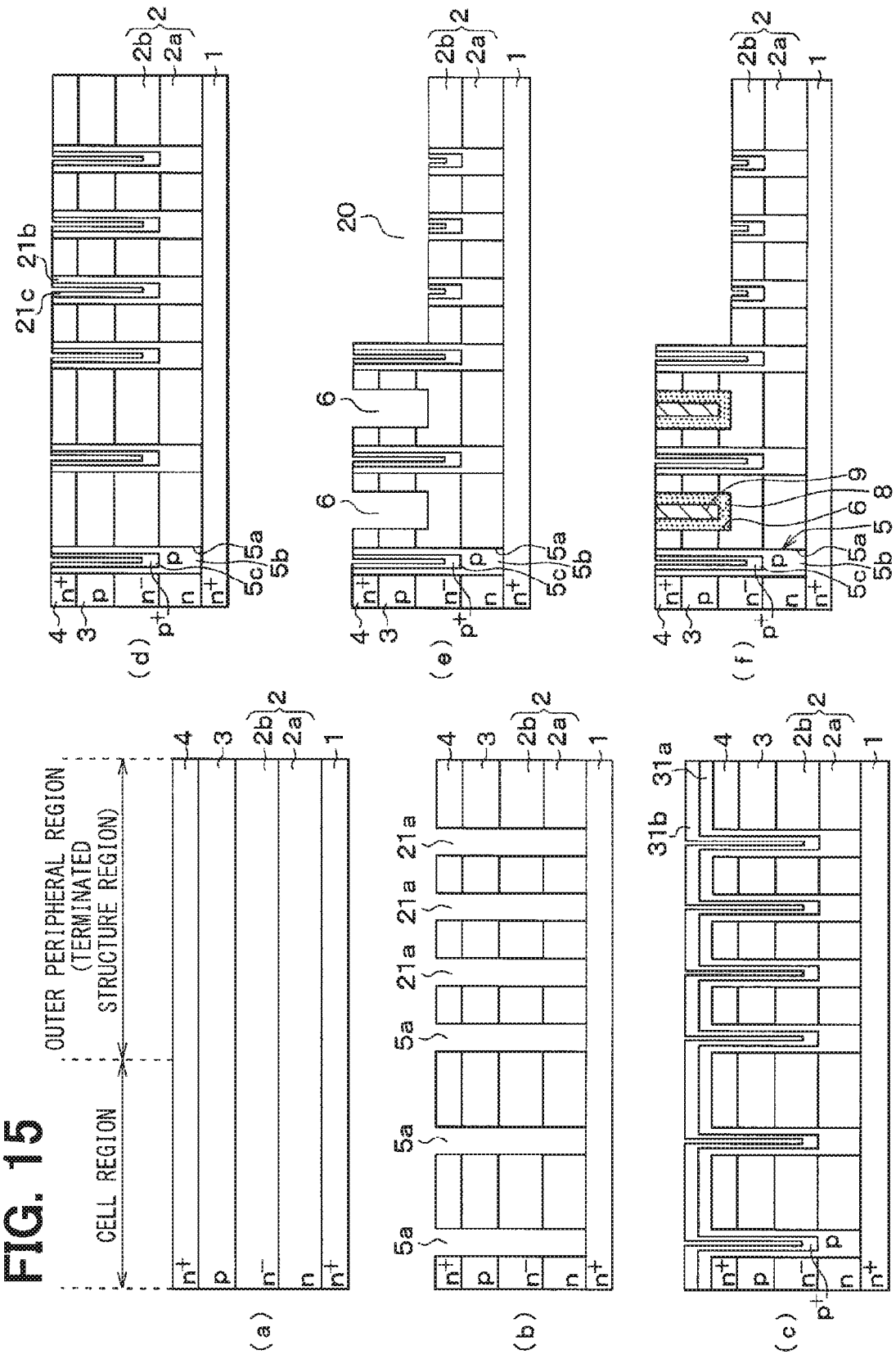
Figure 16:
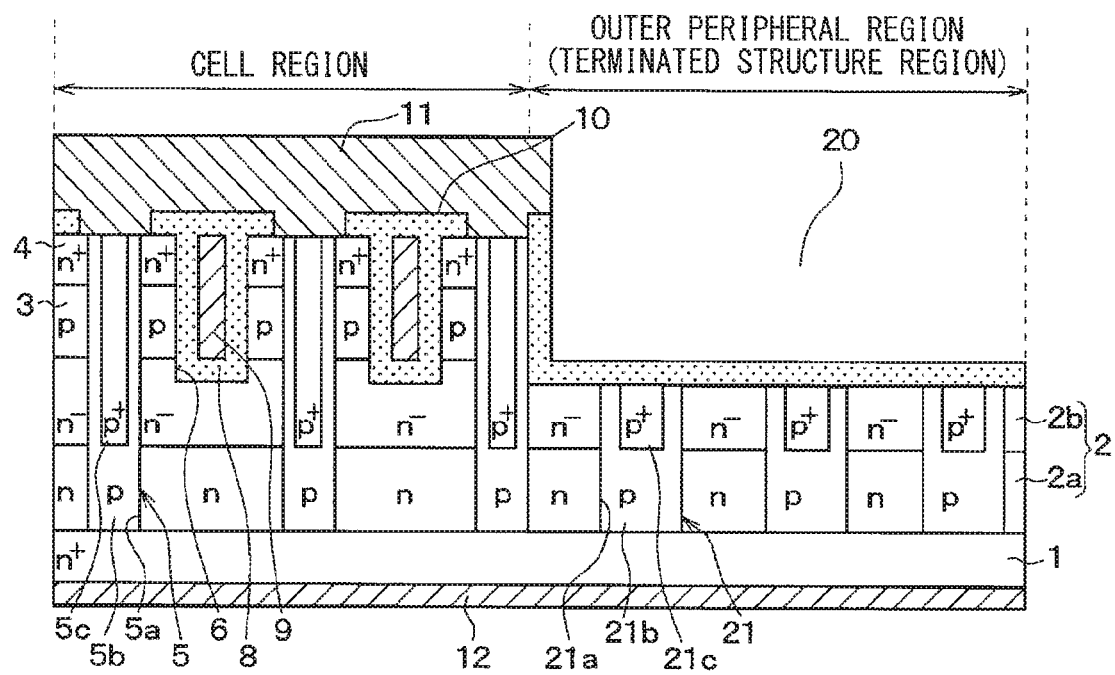
Figure 17:
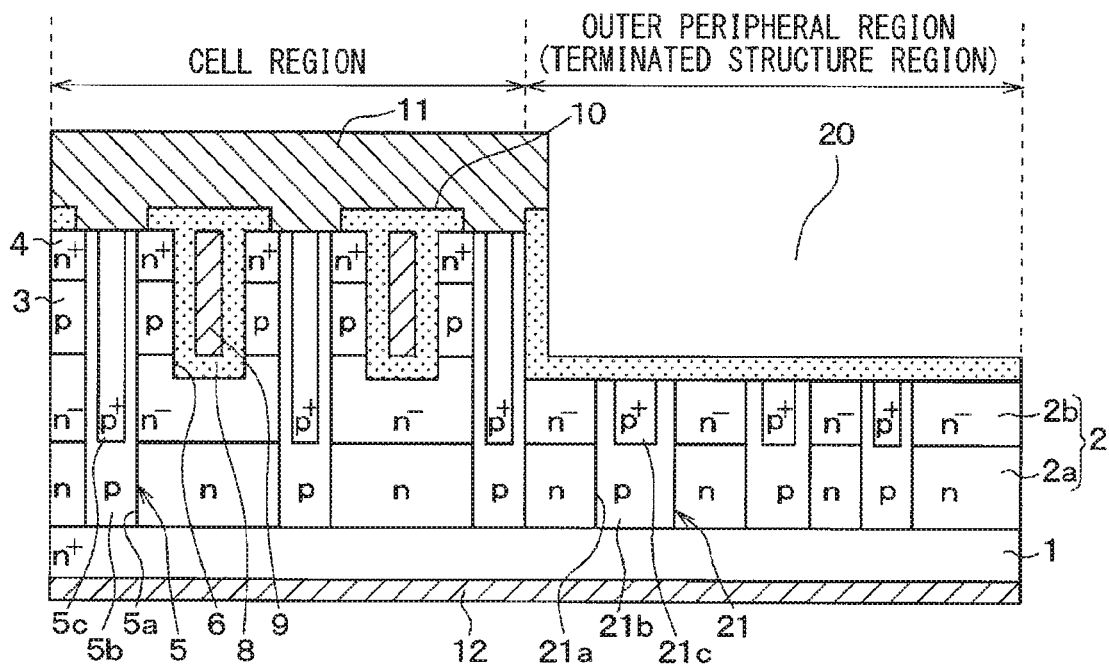
Figure 18:
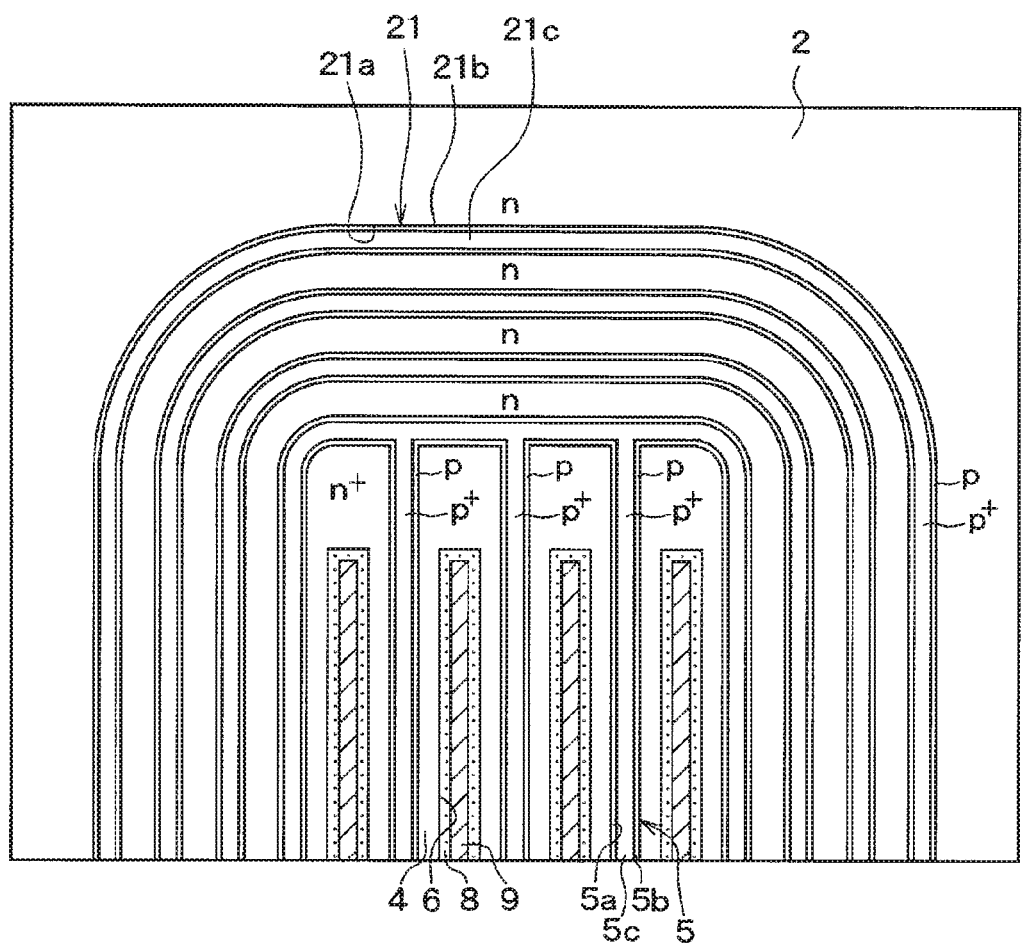

(a) to (f) of FIG. 3 are cross-sectional views illustrating a production process of the SiC semiconductor device shown in FIG. 1;

FIG. 4 is a cross-sectional view of an SiC semiconductor device having a MOSFET with an inversion type trench gate structure according to a second embodiment of the present disclosure;

FIG. 5 is a cross-sectional view of an SiC semiconductor device having a MOSFET with an inversion type trench gate structure according to a third embodiment of the present disclosure;

FIG. 6 is a diagram illustrating an upper layout of an SiC semiconductor device having a MOSFET with an inversion type trench gate structure according to a fourth embodiment of the present disclosure;

FIG. 7 is a cross-sectional view of an SiC semiconductor device having a MOSFET with an inversion type trench gate structure according to a modification of the fourth embodiment;

FIG. 8 is a cross-sectional view of an SiC semiconductor device having a MOSFET with an Inversion type trench gate structure according to a fifth embodiment of the present disclosure;

FIG. 9 is a cross-sectional view of an SiC semiconductor device having a MOSFET with an inversion type trench gate structure according to a sixth embodiment of the present disclosure;

FIG. 10 is a diagram illustrating an upper layout of an SiC semiconductor device having a MOSFET with an inversion type trench gate structure according to a seventh embodiment of the present disclosure;

FIG. 11 is a diagram illustrating an upper layout of an SiC semiconductor device having a MOSFET with an inversion type trench gate structure according to an eighth embodiment of the present disclosure;

FIG. 12 is a diagram illustrating an upper layout of an SiC semiconductor device having a MOSFET with an inversion type trench gate structure according to a ninth embodiment of the present disclosure;

FIG. 13 is a cross-sectional view of the SiC semiconductor device taken along a line XIII-XIII in FIG. 12;

FIG. 14 is a cross-sectional view of an SiC semiconductor device having a MOSFET with an inversion type trench gate structure according to a tenth embodiment of the present disclosure;

(a) to (f) of FIG. 15 are cross-sectional views illustrating a production process of the SiC semiconductor device shown in FIG. 14;

FIG. 16 is a cross-sectional view of an SiC semiconductor device having a MOSFET an inversion type trench gate structure explained as another embodiment;

FIG. 17 is a cross-sectional view of an SiC semiconductor device having a MOSFET an inversion type trench gate structure explained as another embodiment; and FIG. 18 is a diagram illustrating an upper layout of an SiC semiconductor device having a MOSFET an inversion type trench gate structure explained as another embodiment.

DESCRIPTION OF EMBODIMENTS

Hereinafter, embodiments of the present disclosure will be described with reference to the drawings. Note that, in each of the embodiments described hereinafter, the same or equivalent parts will be designated with like reference numbers.

(First Embodiment)

A first embodiment of the present disclosure will be described.

Hereinafter, an SiC semiconductor device formed with an inversion type MOSFET, as an example of a semiconductor switching element with a trench gate structure, will be described.

An SiC semiconductor device shown in FIG. 1 has a structure that includes a cell region in which a semiconductor element is formed, and an outer peripheral region (terminated structure region) in which an outer peripheral withstand voltage structure surrounding the cell region is provided. In the present embodiment, as the semiconductor element, the MOSFET with the inversion type trench gate structure is provided.

Figure 2:
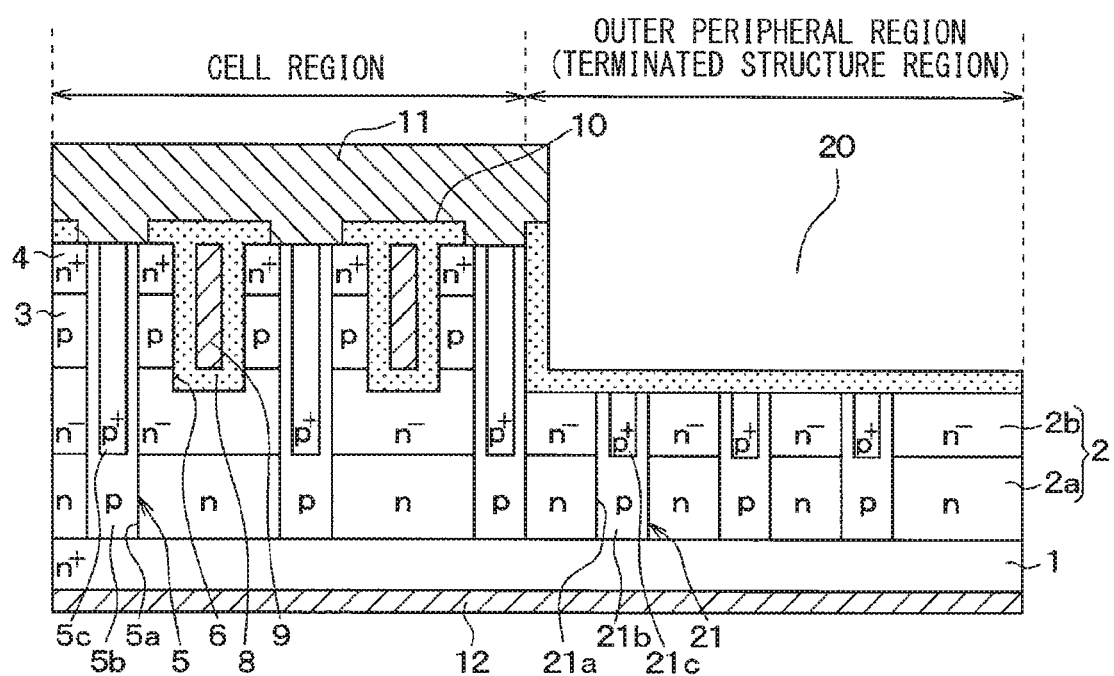
FIG. 2 is a cross-sectional view of the SiC semiconductor device taken along a line II-II in FIG. 1.

As shown in FIG. 2, the SiC semiconductor device is formed using a semiconductor substrate in which an n⁻ type drift layer 2, a p type base region 3, and an n⁺ type source region 4, which are made of SiC, are subsequently epitaxially grown on a main surface of an n⁺ type substrate 1 made of SiC.

The n⁺ type substrate 1 has an n type impurity concentration of $1.0\times10^{19}/cm^3$, for example, and a thickness of approximately 300 μm. In the n type drift layer 2, a lower layer portion 2a and an upper layer portion 2b have different n type impurity concentrations. The lower layer portion 2a has, for example, the n type impurity concentration of 1.5 to $6.0\times10^{16}/cm^3$, and the thickness of 6.0 μm. The upper layer portion 2b has, for example, the n type impurity concentration of 0.5 to $2.0\times10^{16}/cm^3$, which is lower than that of the lower layer portion 2a, and the thickness of 2.0 μm. The lower layer portion 2a is a portion forming n type columns, and the impurity concentration and the width thereof are determined considering charge balance with p type columns, which will be described later.

The p type base region 3 has, for example, a p type impurity concentration of 1.5 to $6.0\times10^{16}/cm^3$, and the thickness of approximately 0.5 μm. The n⁺ type source region 4 is formed such that an n type impurity concentration at a surface layer portion thereof is, for example, $2.5\times10^{18}$ to $1.0\times10^{19}/cm^3$, and has the thickness of approximately 0.5 μm.

In the cell region, the p type base region 3 and the n⁺ type source region 4 remain on a side adjacent to the main surface of the semiconductor substrate. A p type region 5 is formed to pass through the n⁺ type source region 4 and the p type base region 3 and to reach the n type drift layer 2.

The p type region 5 is formed to be filled in a trench 5a that is formed to reach the n⁺ type substrate 1. The p type region 5 includes two regions 5b, 5c having different p type impurity concentrations. In particular, the p type region 5 is provided by the low concentration region 5b and the high concentration region 5c. The low concentration region 5b is formed on an inner wall surface of the trench 5a, that is, on a bottom surface and side surfaces of the trench 5a. The high concentration region 5c has the p type impurity concentration higher than that of the low impurity concentration region 5b.

The low concentration region 5b is a portion providing a p type column. For example, the low concentration region 5b has the p type impurity concentration of $4.15\times10^{16}$ to $1.65\times10^{17}$ cm³, the width of 0.8 μm, and the thickness of 8 μm. In particular, the p type column is provided by a portion of the low concentration region 5b formed on the bottom surface of the trench 5a, and the thickness of this portion is substantially equal to the thickness of the lower layer portion 2a. The width of the low concentration region 5b (that is, the width of the trench 5a) and the p type impurity concentration of the low concentration region 5b are determined considering charge balance with the n type column.

The high concentration region 5c is a portion providing a p⁺ type deep layer. The high concentration region 5c is formed such that the bottom of the high concentration region 5c is located at a position deeper than the bottom of a trench 6 that forms a trench gate structure, which will be described later. Thus, the high concentration region 5c is formed such that body brake preferentially occurs at the bottom thereof. The p type impurity concentration and the width of the high concentration region 5c are determined to restrict complete depletion at the time of body break. For example, the p type impurity concentration of the high concentration region 5c is $2.5\times10^{18}$ to $1.0\times10^{19}/cm^3$, and the depth of the high concentration region 5c is 3 μm. For example, in a case where the n type impurity concentration of the upper layer portion 2b of the n type drift layer 2 is set to $1.0\times10^{16}/cm^3$, and it is assumed that drain voltage of 1200 V is applied at the time of turning off. In this case, when the p type impurity concentration and the width of the high concentration region 5c have the above-described values, a region that is not depleted remains even when reaching the breakdown electric field intensity. For this reason, a breakdown current can be effectively drawn.

The p type region 5 configured as described above has a layout including a rectangular portion with rounded corners surrounding an outer edge of the cell region and a plurality of line-shaped portions each defining a longitudinal direction in one direction and being arranged in a stripe pattern inside of the rectangular portion, as shown in FIG. 1.

The trench 6 is formed to pass through the p type base region 3 and the n⁺ type source region 4 and to reach the n type drift layer 2. The trench 6 has the width of 0.8 μm and the depth of 2.0 μm, for example. The p type base region 3 and the n⁺ type source region 4 are arranged to adjoin the side surface of the trench 6. The trench 6 has a line-shaped layout in which a width direction corresponds to a right and left direction on the paper of FIG. 2, a longitudinal direction corresponds to a direction perpendicular to the plane surface of FIG. 2, and a depth direction corresponds to the up and down direction on the plane surface of FIG. 2.

A plurality of the trenches 6 are arranged parallel to each other at an equal interval into a stripe pattern. Each of the line-shaped portions of the p type region 5 is arranged in between the trenches 6. The side surface of each of the trenches 6 and the p type region 5 are spaced from each other by a predetermined distance. A channel is formed in a portion of the p type base region 3 contacting with the side surface of the trench 6, thereby to allow an electric current to flow. As shown in FIG. 1, the end of the p type region 5 is projected by a distance a relative to the end of each trench 6. The distance a is greater than the thickness of the lower layer portion 2*a* of the n type drift layer 2. In other words, the distance a is greater than a distance between the lower surface of the high concentration region 5*c* and a lower surface of the n type drift layer 2. Thus, the end of each trench 6 is located more to inside than the end of the high concentration region 5*c*.

Further, an Inner wall surface of the trench 6 is covered with a gate insulation film 8. The gate insulation film 8 is, for example, provided by a thermal oxide film formed by thermally oxidizing the inner wall surface of the trench 6, for example. The thickness of the gate insulation film 8 on the side surface and the bottom of the trench 6 is approximately 75 nm. In FIGS. 1 and 2, the corners of the bottom and the ends of the gate insulation film 8 are edged. Alternatively, the corners of the bottom and the ends of the gate insulation film 8 may have rounded shapes by subjecting the trench 6 to a rounding treatment beforehand. In such a case, the gate insulation film 8 can entirely have a uniform thickness, and it is less likely that the thickness of the gate insulation film 8 will be reduced at the corner portions of the trench 6. Further, a gate electrode 9 is formed on the surface of the gate insulation film 8 to fill the trench 6.

A source electrode 11 and a gate wiring (not shown) are formed on the surfaces of the n+ type source region 4 and the p type region 5 and the surface of the gate electrode 9 through an interlayer insulation film 10. The source electrode 11 and the gate wiring are made of plural metals (for example, Ni and Al), in such a manner that at least a portion contacting with the n type SiC (in particular, the n+ type source region 4) is made of a metal that can make an ohmic contact with the n type SiC, and at least a portion contacting with the p type SiC (in particular the p type region 5) is made of a metal that can make an ohmic contact with the p type SiC. The source electrode 11 and the gate wiring are electrically insulated as being formed on the interlayer insulation film 10. Via contact holes formed in the interlayer insulation film 10, the source electrode 11 is electrically in contact with the p type base region 3 through the n+ type source region 4 and the p type region 5, and the gate wiring is electrically in contact with the gate electrode 9.

A drain electrode 12 is formed on the rear side of the n+ type substrate 1 to be electrically connected to the n+ type substrate 1. By such a structure, the MOSFET with the n-channel type, inversion type trench gate structure is formed. The cell region is provided as the MOSFETs are arranged between the p type regions 5.

On the other hand, the outer peripheral region has a mesa-structure as a recessed portion 20 is formed to extend through the n+ type source region 4 and the p type base region 3 and to reach the n type drift layer 2. For this reason, the p type base region 3 is removed and the n type drift layer 2 is exposed at a position away from the cell region.

In the surface layer portion of the drift layer 2 located under the recessed portion 20, a plurality of p type impurity-embedded layers 21 (three layers 21 are shown in FIG. 1) are provided so as to surround the cell region. Similar to the p type region 5 described above, the p type impurity-embedded layer 21 has a low concentration region 21*b* and a high concentration region 21*c* within the trench 21*a*. The high concentration region 21*c* of the p type impurity embedded layer 21 serves as a guard ring. The p type impurity-embedded layer 21 may be formed with a concentration that can serve as the guard ring. In the present embodiment, each of the low concentration region 21*b* and the high concentration region 21*c* has the same concentration as the low concentration region 5*b* of the p type region 5. The thickness of the portion of the low concentration region 21*b* formed at the bottom of the trench 21*a* has substantially the same thickness as the lower layer portion 2*a*.

Although not illustrated, an EQR structure may be formed on an outer periphery of the p type-impurity embedded layer 21, as necessary, so that the outer peripheral region having an outer peripheral withstand voltage structure and surrounding the cell region is formed.

The SiC semiconductor device according to the present embodiment has the structure described above. Next, the method for producing the SiC semiconductor device according to the present embodiment will be described with reference to FIG. 3.

[Step Shown in (a) of FIG. 3]

Firstly, as the semiconductor substrate, a triple epitaxial substrate in which the n type drift layer 2, the p type base region 3, and the n+ type source region 4, which are made of SiC, are epitaxially grown on the main surface of the n+ type substrate 1 made of SiC in this order is prepared.

[Step Shown in (b) of FIG. 3]

A mask material (not shown) is placed on the surface of the n+ type source region 4, and then openings are formed in the mask material by photolithography at locations corresponding to positions where the p type region 5 and the p type impurity embedded layer 2 are to be formed. In the state where the mask material is still placed thereon, anisotropic etching, such as RIE (Reactive Ion Etching), is conducted to form the trenches 5*a*, 21*a* at the positions where the p type region 5 and the p type impurity embedded layer 21 are to be formed. Thereafter, the mask material is removed.

[Step Shown in (c) of FIG. 3]

Using an epitaxial growing apparatus, a p type layer (first layer) 31*a*, which is set to have a relatively low impurity concentration, is formed on the entire surface of the n+ type source region 4 including the inside of the trenches 5*a*, 21*a* for providing the low concentration regions 5*b*, 21*b*. Subsequently, an epitaxial growing is conducted by changing the introduction amount of p type dopant to form a p+ type layer (second layer) 31*b* with a relatively high impurity concentration on the p type layer 31*a* for providing the high concentration regions 5*c*, 21*c*. The inside of the trenches 5*a*, 21*a* is filled with the p type layer 31*a* and the p+ type layer 31*b*.

[Step Shown in (d) of FIG. 3]

The surface of the n+ type source region 4 is exposed by flattening, such as by grinding or CMP (Chemical Mechanical Polishing). As a result, the p type layer 31*a* and the p+ type layer 31*b* remain only within the trenches 5*a*, 21*a*. In this way, the low concentration regions 5*b*, 21*b* are provided by the p type layer 31*a*, and the high concentration regions 5*c*, 21*c* are provided by the p+ type layer 31*b*, hence the p type region 5 and the p type impurity embedded layer 21 are formed.

When this step is performed by the flattening and polishing, such as by the CMP, the flattening is conducted with an excellent surface state. Therefore, in the formation of the trenches 6 for the trench gate structure, which will be performed later, the trench shape with high dimensional accuracy can be realized. As such, fine elements can be easily realized. The p type region 5 and the p type impurity embedded layer 21 are made by the epitaxial growing. Therefore, a PN junction with less damage by ion implantation can be formed, differently from the ion implantation. Further, the layer with a large aspect ratio, which cannot be made by the ion implantation, can be made. Therefore, it is easy to make the cell size fine.

[Step Shown in (e) of FIG. 3]

A mask material (not shown) is placed on the surfaces of the $n^+$ type source region 4, the p type region 5 and the p type impurity embedded layer 21, and then openings are formed in the mask material by photolithography at locations corresponding to positions where the trenches 6 and the recessed portion 20 are to be formed. Then, in the state where the mask material is still placed thereon, anisotropic etching, such as RIE, is performed to form the trenches 6 in the cell region and the recessed portion 20 in the outer peripheral region. Thereafter, the mask material is removed.

Further, as necessary, hydrogen etching is implemented through a heat treatment in a hydrogen atmosphere under decompression at 1600 degrees Celsius or higher, such as a high-temperature hydrogen atmosphere of, for example 1625° C. and $2.7 \times 10^4$ Pa (200 Torr). By this hydrogen etching, the rounding treatment of the inner wall surface of the trench 6 is conducted, and the inlet of the opening of the trench 6 and the corner of the trench 6 are rounded, and damage due to the trench etching is removed.

[Step Illustrated in (f) of FIG. 3]

The gate insulation film 8 is formed by thermal oxidation in a wet atmosphere, and then a doped polysilicon layer is formed on the surface of the gate insulation film 8. The doped polysilicon layer is patterned to leave within the trench 6, thereby forming the gate electrode 9. Subsequently, similarly to conventional steps, a step of forming the interlayer insulation film 10, a step of forming contact holes by a photolithography etching, a step of forming the source electrode 11 and the gate wiring layer by depositing an electrode material and then patterning the electrode material, a step of forming the drain electrode 12 on the rear surface of the $n^+$ type substrate 1, and the like are performed. As a result, the SiC semiconductor device including the cell region having the MOSFETs with the trench gate structure and the outer peripheral region having the outer voltage withstand structure surrounding the cell region, as shown in FIG. 2, is produced.

As described hereinabove, the present embodiment is configured to have the p type region 5 in the cell region. The p type region 5 has the low concentration region 5b and the high concentration region 5c that are filled in the trench 5a extending to the $n^+$ type substrate 1. With this structure, the p type column is made of the low concentration region 5b, and the $p^+$ type deep layer is made of the high concentration region 5c.

As such, since the SJ structure is provided by the p type column made of the low concentration region 5b and the n type column made of the n type drift layer 2, it is possible to reduce the on-state resistance. Also, a drain potential can be blocked by the $p^+$ type deep layer made of the high concentration region 5c at the time of turning off. Therefore, an electric field applied to the gate insulation film 8 can be alleviated, and breakage of the gate insulation film 8 can be restricted. Similarly, the drain potential can be blocked by the $p^+$ type deep layer made of the high concentration region 5c at the time of turning off. Therefore, it is possible to restrict the electric field of the p type base region 3 from being increased. As such, even when the impurity concentration of the p type base region 3 is set to a low concentration to obtain high mobility of the channel, an occurrence of punch through is reduced, and a high drain withstand voltage can be achieved. Further, since the high concentration region 5c is directly connected to the source electrode 11, it is possible to realize the element with high surge resistance. Accordingly, the SiC semiconductor device capable of reducing the on-state resistance and restricting the breakage of the gate insulation film 8 can be made.

In addition, the end of the p type region 5 is arranged to be projected by the distance a relative to the end of each trench 6, and the distance a is greater than the thickness of the lower layer portion 2a of the n type drift layer 2, that is, the distance between the lower surface of the high concentration region 5c and the lower surface of the n type drift layer 2. Because of such a layout, the end of each high concentration region 5c is necessarily projected more than the end of each trench 6. Also at the end of the trench 6, the electric field applied to the gate insulation film 8 is alleviated, and the breakage of the gate insulation film 8 can be restricted.

Further, in the SiC semiconductor device having such structures, the low concentration region 5b and the high concentration region 5c are made by subsequently filling the p type layers having different impurity concentrations. Therefore, the production process can be simplified, as compared with a case where the low concentration region 5b for providing the p column and the high concentration region 5c for providing the $p^+$ type deep layer are separately formed in independent steps.

Also, the outer peripheral region is also provided with the p type impurity embedded layer 21 having the similar structure to the p type region 5 of the cell region. The p type impurity embedded layer 21 is configured to have the low concentration region 21b and the high concentration region 21c filled in the trench 21a extending to the $n^+$ type substrate 1. Therefore, the function of the guard ring can be achieved by the high concentration region 21c. In addition, since the p type impurity embedded layer 21 can be formed simultaneously with the p type region 5, the step of forming the p type impurity embedded layer 21 and the step of forming the p type region 5 can be shared, and thus the production process can be simplified.

(Second Embodiment)

A second embodiment of the present disclosure will be described. The present embodiment is different from the first embodiment in regard to the depth of the trench 6 and the recessed portion 20. The others are similar to those of the first embodiment. Therefore, only a part different from the first embodiment will be described.

In the present embodiment, as shown in FIG. 4, the trench 6 and the recessed portion 20 are different in depth. In particular, the recessed portion 20 is deeper than the trench 6. In the case where the trench 6 and the recessed portion 20 are set to have different depths, it is possible to design the withstand voltage for each of the trench 6 and the recessed portion 20. It is possible to suitably adjust the withstand voltage such that breakdown is generated in the outer peripheral region, for example.

In the production process of the SiC semiconductor device having such a structure, the step of forming the trench 6 and the step of forming the recessed portion 20 are performed as different steps, and the other steps are similar to those of the first embodiment.

(Third Embodiment)

A third embodiment of the present disclosure will be described. In the present embodiment, a structure of the p type impurity embedded layer 21 is modified from that of the first embodiment, and the others are similar to those of the first embodiment. Therefore, only a part different from the first embodiment will be described.

In the present embodiment, as shown in FIG. 5, the depth of the trenches 21a and the p type impurity embedded layers 21 is varied. The depth of the trenches 21a and the p type impurity embedded layers 21 is gradually reduced as a function of distance from the cell region in an outward direction. In this way, the depth of the p type impurity embedded layers 21 is gradually varied. Therefore, it is possible to configure the p type impurity embedded layers 21 with the shape according to an equipotential line distribution in the outer peripheral region, and thus it is possible to reduce the region necessary for a termination structure. For this reason, it is possible to reduce the size of the SiC semiconductor device.

To form the p type impurity embedded layers 21 having different depths, there is a method of varying the depth by forming the trenches 21a in separate steps. Alternatively, it is possible to employ a method of reducing the width of the trenches 21a as a function of distance from the cell region. An etching gas is more difficult to enter the trenches 21a with the decrease in the width of the trenches 21a, and thus an etching rate is retarded. For this reason, by decreasing the width of the trenches 21a as a function of distance from the cell region, even if the trenches 21a for forming the p type impurity embedded layers 21 are formed simultaneously, the depth of each trench 21a can be varied. Therefore, by employing this method, the trenches 21a are not formed in separate steps, but can be formed simultaneously. Therefore, the production process can be simplified.

(Fourth Embodiment)

A fourth embodiment of the present disclosure will be described. In the present embodiment, a p type RESURF region is provided in addition to the structure of the first embodiment. The others are similar to those of the first embodiment. Therefore, only a part different from the first embodiment will be described.

As shown in FIG. 6, the recessed portion 20 formed in the outer peripheral region has a stepped shape so that the depth of the recessed portion 20 increases stepwise as a function of distance from the cell region in the outward direction. The bottom of a step of the recessed portion 20 adjacent to the cell region is set to a position shallower than the bottom of the p type base region 3, and is in a state where the p type base region 3 remains thereunder. The bottom of a step of the recessed portion 20 further from the cell region is deeper than the bottom of the p type base region 3 and is in a state where the p type base region 3 does not remain thereunder.

In the SiC semiconductor device having such a structure, it is possible to function the p type base region 3 remaining at the bottom of the step of the recessed portion 20 adjacent to the cell region as a p type RESURF layer 22. The p$^+$ type RESURF layer 22 is located more to inside than the p type impurity embedded layer 21 while surrounding the cell region. The p$^+$ type RESURF layer 22 is formed to have a rectangular-shaped layout with rounded corners, similar to the p type impurity embedded layer 21.

As discussed above, it is possible to have the p type RESURF layer 22, in addition to the p type impurity embedded layer 21. Because the electric field can be further effectively alleviated, the area of the termination structure, which does not contribute as the cell region, can be reduced. Accordingly, the size (chip size) of the SiC semiconductor device can be reduced, resulting in the reduction of manufacturing costs.

(Modification of Fourth Embodiment)

The structure being provided with the p type RESURF layer 22 as the above-described fourth embodiment can also be implemented by forming the p type RESURF layer 22 in the surface layer portion of the n type drift layer 2, as shown in FIG. 7. For example, the p type RESURF layer 22 can be formed by ion implantation of a p type impurity using a mask, after the recessed portion 20 is formed.

(Fifth Embodiment)

A fifth embodiment of the present disclosure will be described. In the present embodiment, the structure on a periphery of the p type region 5 is modified from that of the first embodiment. The others are similar to those of the first embodiment. Therefore, only a part different from the first embodiment will be described.

As shown in FIG. 8, a surrounding region 23 made of an n$^-$ type layer or an I type layer is provided to surround the periphery of the p type region 5. The surrounding region 23 is formed by epitaxial growing to cover the inner wall surface of the trench 5a with a predetermined thickness. The low concentration region 5b and the high concentration region 5c are formed inside of the surrounding region 23. Thus, the p type region 5 surrounded by the surrounding region 23 is made.

As discussed above, since the surrounding region 23 is provided, it is possible to reduce a drain-to-source capacity at the time of turning on. Since the steep drain-to-source capacity, which is specific for the SJ structure, can be reduced, switching characteristics can be further improved.

(Sixth Embodiment)

A sixth embodiment of the present disclosure will be described. In the present embodiment, the structure of the p type impurity embedded layer 21 is modified from that of the first embodiment. The others are similar to those of the first embodiment. Therefore, only a part different from the first embodiment will be described.

As shown in FIG. 9, the p type impurity embedded layer 21 may be made only by the low concentration region 21b, without the high concentration region 21c. As discussed above, when the high concentration region 21c is deleted from the outer peripheral region, the withstand voltage can be further improved.

Such a structure can be, for example, produced by the following method. For example, the trenches 5a, 21a are separately formed so that the trench 21a is shallower than the trench 5a. As a result, the high concentration region 21c can have the bottom at a position higher than the bottom of the high concentration region 21c. For this reason, when the recessed portion 20 is formed, the high concentration region 21c can be fully removed. Thus, the structure of FIG. 9 can be realized. For example, the trench 6 and the recessed portion 20 are separately formed, and the depth of the recessed portion 20 is made deeper, so that the high concentration region 21c formed in the trench 21a is fully removed. Also in this case, the structure of FIG. 9 can be realized. The width of the trench 21a can be made smaller than the width of the trench 5a, so that the etching rate is retarded in the trench 21a than the trench 5a. As a result, the bottom of the high concentration region 21 can be made at a position higher than the bottom of the high concentration region 5c. In this case, the high concentration region 21c can be fully removed when the trench 6 and the recessed portion 20 are simultaneously formed. As such, the structure of FIG. 9 can be realized.

(Seventh Embodiment)

A seventh embodiment of the present disclosure will be described. In the present embodiment, the outer peripheral withstand voltage structure of the outer peripheral region is modified from that the first embodiment. The others are similar to those of the first embodiment. Therefore, only a part different from the first embodiment will be described.

As shown in FIG. 10, the p type impurity embedded layer 21 provided in the outer peripheral region is formed to have a dot-shaped layout. The interval of dots may be constant. Alternatively, it is preferable that the interval of the dots increases as a function of distance from the cell region in an outward direction, as shown in FIG. 10. In this structure, it is possible to reduce a range requiring alleviation of the electric field. Thus, it is possible to reduce the size of the SiC semiconductor device.

Note that, in the drawing, the portion taken along a double dashed chain line has a cross-sectional shape similar to the shape of FIG. 2. Even if the p type impurity embedded layer 21 has the dot-shaped layout, the structure similar to the first embodiment can be made. Needless to say, the depth of the p type impurity embedded layer 21 may be gradually reduced, as shown in FIG. 5. Also, the p type impurity embedded layer 21 may be made only by the low concentration region 21b, as shown in FIG. 9. Further, the p type RESURF layer 22 may be provided, as shown in FIG. 6 and FIG. 7.

(Eighth Embodiment)

An eighth embodiment of the present disclosure will be described. In the present embodiment, the outer peripheral withstand voltage structure of the outer peripheral region is modified from that of the first embodiment. The other structures are similar to those of the first embodiment. Therefore, only a part different from the first embodiment will be described.

As shown in FIG. 11, as the outer peripheral withstand voltage structure of the outer peripheral region, the p type region 5 is provided also in the outer peripheral region, in place of the p type impurity embedded layer 21. That is, also in the outer peripheral region, the p type region 5 arranged in the stripe pattern is provided, similar to the cell region, thereby providing the SJ structure. As discussed above, as the outer peripheral withstand voltage structure, the SJ structure can be provided. In the case where the outer peripheral withstand voltage structure also has the SJ structure, the SJ structure of the outer peripheral withstand voltage structure can have the same structure as that of the cell region. That is, the p type region 5 can be formed at the same pitch, the same depth and the same concentration as those of the SJ structure of the cell region. Therefore, the design of charge balance of the outer peripheral region is eased, and the production process is eased.

In this case, the p type RESURF layer 22 is also provided in the present embodiment. The end of the p type region 5 is terminated at an outline of the p type RESURF layer 22. In this way, when the p type RESURF layer 22 is provided, the electric field is further alleviated at the outer peripheral region. As such, the withstand voltage can be improved.

(Ninth Embodiment)

A ninth embodiment of the present disclosure will be described. In the present embodiment, a junction barrier Schottky diode (hereinafter referred to as JBS) is provided in the structure of the first embodiment, in place of or together with the outer peripheral region. The others are similar to those of the first embodiment. Therefore, only a part different from the first embodiment will be described.

In the present embodiment, as shown in FIGS. 12 and 13, a Schottky electrode 24 is provided at the outer end portion of the cell region. In particular, the recessed portion 20 is also formed at the outer end portion of the cell region. The interlayer insulation film 10 is removed to expose the n type drift layer 2 in the recessed portion 20. The Schottky electrode 24 is formed on the surface of the portion of the n type drift layer 2 exposed to have Schottky contact with the n type drift layer 2. The p type region 5 is formed also at the outer end portion of the cell region to contact with the Schottky electrode 24.

By such a structure, the JBS having a Schottky barrier diode (SBD) provided by the contact between the Schottky electrode 24 and the n type drift layer 2, and the PN diode provided by the p type region 5 and the n type drift layer 2 is made. As discussed above, the SiC semiconductor device can have the JBS, in addition to the MOSFET with the trench gate structure.

Such a structure can be realized only by forming the Schottky electrode 24 in the SiC semiconductor device of the structure of the first embodiment. As such, the SiC semiconductor device having the structure of the present embodiment can be realized only by adding a step of forming a film of the Schottky electrode 24.

(Tenth Embodiment)

A tenth embodiment of the present disclosure will be described. In the present embodiment, the structure inside of the trenches 5a, 21a is modified from that of the first embodiment. The others are similar to those of the first embodiment. Therefore, only a part different from the first embodiment will be described.

In the present embodiment, as shown in FIG. 14, the source electrode 11 is partly disposed in the trench 5a, in addition to the low concentration region 5b and the high concentration region 5c, such that the high concentration region 5c and the source electrode 11 are in contact with each other within the trench 5a. Further, the Interlayer insulation film 10 (or the gate insulation film 8) is partly disposed in the trench 21a, in addition to the low concentration region 21b and the high concentration region 21c.

As described above, it is not necessary that the trenches 5a, 21a are entirely filled with the low concentration region 5b, 21b and the high concentration region 5c, 21c. It may be possible that there is unfilled portion at a part in the trenches 5a, 21a. Further, the source electrode 11 may be partly disposed in the unfilled portion of the trench 5a, and the interlayer insulation film 10 may be partly disposed in the unfilled portion of the trench 21a.

In particular, in the structure where the source electrode 11 is partly disposed in the trench 5a, an internal resistance from the bottom of the high concentration region 5c to the source electrode 11 can be reduced, as compared with a case where the trench 5a is fully filled with the low concentration region 5b and the high concentration region 5c. For this reason, the resistance of the p$^+$ type deep layer that is substantially made of the high concentration region 5c can be reduced.

In the example of FIG. 14, the bottom of the unfilled portion in the trench 5a that is not filled with the low concentration region 5b and the high concentration region 5c is at a position deeper than the bottom of the trench 6 that forms the trench gate structure. Alternatively, the bottom of the unfilled portion in the trench 5a may be at a position shallower than the bottom of the trench 6. In such a case, only the trench 5a may not be fully filled with the low concentration region 5b and the high concentration region 5c, but the trench 21a may be filled with the low concentration region 21b and the high concentration region 21c.

Next, a method for producing the SiC semiconductor device according to the present embodiment will be described with reference to FIG. 15.

Firstly, in steps shown in (a) to (c) of FIG. 15, the similar steps to (a) to (c) of FIG. 3 described in the first embodiment are performed. It is to be noted that, in the step shown in (c) of FIG. 15, the trenches 5a, 21a are not fully filled with the p type layer 31a and the p+ type layer 31b forming the low concentration regions 5b, 21b and the high concentration regions 5c, 21c, and cavities partly remain in the trenches 5a, 21a.

Thereafter, in the steps shown in (d) and (e) of FIG. 15, the similar steps to (d) and (e) of FIG. 3 described in the first embodiment are performed. In the step shown in (f) of FIG. 15, the trench gate structure is formed in the trench 6 by the step similar to (f) of FIG. 3, and then the step of forming the interlayer insulation film 10 is formed.

At this time, the insulation film is entered in the unfilled portions of the trenches 5a, 21a that are not filled with the low concentration regions 5b, 21b and the high concentration regions 5c, 21c, at the same time as forming the interlayer insulation film 10 (or gate insulation film 8). For this reason, in a contact hole forming step of forming contact holes in the interlayer insulation film 10, which will be performed later, the insulation film that has been entered in the trench 5a is removed simultaneously while protecting the trench gate structure and the inside of the recessed portion 20 with a mask. When the step of forming the source electrode 11 is then performed, the source electrode 11 is partly disposed in the trench 5a.

In this way, the SiC semiconductor device according to the present embodiment can be produced. As described above, the SiC semiconductor device can be produced by the similar production process to that of the first embodiment, except for only changing the mask for patterning the interlayer insulation film 10 from that of the first embodiment.

(Other Embodiments)

In each of the embodiments described above, an example to which the present disclosure is applied is described. However, design changes can be suitably applied. For example, in each of the embodiments described above, the oxide film made by thermal oxidation is employed as the example of the gate insulation film 8. Alternatively, the gate insulation film 8 may be provided by an oxide film that is made by a method other than the thermal oxidation or a nitride film. The step of forming the drain electrode 12 may be performed before the forming of the source electrode 11.

In the case where the p type region 5 and the p type impurity embedded layer 21 have the same depth in each of the embodiments described above, it is not always necessary that the p type region 5 and the p type impurity embedded layer 21 have the same width. The p type region 5 and the p type impurity embedded layer 21 may have different widths. For example, as shown in FIG. 16, the width of the p type impurity embedded layer 21 may be greater than the width of the p type region 5. As shown in FIG. 17, the width of the p type impurity embedded layer 21 may be gradually reduced toward the outside of the cell region. As shown in FIG. 18, the p type region 5 may have a layout including the stripe-shaped portions in the cell region and a rectangular-shaped portion with rounded corners similar to the first embodiment, but the stripe-shaped portions and the rectangular-shaped portion may be connected to each other, in place of being separated from each other.

It is not always necessary to use the triple epitaxial substrate as the semiconductor substrate. For example, it may be used a semiconductor substrate in which the n− type drift layer 2 is epitaxially grown on the n+ type substrate 1, the p type base region 3 is formed by ion implantation of a p type impurity on a surface layer portion of the n− type drift layer 2, and the n+ type source region 4 is formed in the surface layer portion of the p type base region 3 by ion implantation to an n type impurity.

The embodiments described above can be suitably combined. For example, the structure in which the depth of the trench 21a is gradually reduced as a function of distance from the cell region, as described in the third embodiment, can be employed to the second, fourth to ninth embodiments. Likewise, the structure having the JBS as the ninth embodiment can be employed to the second to eighth embodiments. In the first, seventh to ninth embodiments and the other embodiments, examples of the layouts of the SiC semiconductor device are described with reference to FIGS. 1, 10 to 12 and 18. Each of these layouts can be employed to each of the second to sixth embodiments and the structures shown in FIGS. 16 and 17.

In each of the embodiments described above, the n channel type MOSFET in which a first conductivity type is the n type and a second conductivity type is a p type is exemplarily described. The present disclosure can be applied to a p channel type MOSFET in which the conductivity type of each element is reversed. In the above description, the MOSFET with the trench gate structure is exemplarily described. Alternatively, the present disclosure may be applied to an IGBT with a similar trench gate structure. In the IGBT, the conductivity type of the substrate 1 is only changed from the n type to the p type in each of the embodiments described above. The other structures and production methods are similar to those of each of the embodiments described above.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

The invention claimed is:

1. A silicon carbide semiconductor device comprising:
   a first or second conductivity type substrate made of silicon carbide;
   a drift layer disposed on the substrate, the drift layer made of a first conductivity type silicon carbide having an impurity concentration lower than that of the substrate, the drift layer including a lower layer portion and an upper layer portion, the upper layer portion being disposed above the lower layer portion and having an impurity concentration lower than that of the lower layer portion, each of the upper layer portion and lower layer portion has a uniform dopant concentration;
   a base region disposed on the drift layer, the base region made of a second conductivity type silicon carbide;
   a source region disposed in an upper layer portion of the base region, the source region made of a first conductivity type silicon carbide having an impurity concentration higher than that of the drift layer;
   a first trench that extends from a surface of the source region to a position deeper than the base region, the trench gate structure including a gate insulation film disposed on an inner wall surface of the first trench and a gate electrode disposed on the gate insulation film;

a second conductivity type region disposed in a second trench that extends from the surface of the source region to the drift layer while passing through the base region and is deeper than the first trench, the second conductivity type region including a second conductivity type first low concentration region and a second conductivity type first high concentration region, the first low concentration region having a second conductivity type impurity concentration being set relatively low, the first high concentration region being disposed on a surface of the first low concentration region and having a second conductivity type impurity concentration being set higher than that of the first low concentration region, the first high concentration region being deeper than the first trench to provide a deep layer;

a source electrode electrically connected to the base region through the source region and the second conductivity type region; and a drain electrode disposed on a rear surface of the substrate, wherein the silicon carbide semiconductor device is provided with a semiconductor switching element with an inversion type trench gate structure in which an inversion type channel region is formed on a surface portion of the base region located on a side surface of the first trench by controlling an application voltage to the gate electrode to cause an electric current between the source electrode and the drain electrode through the source region and the drift layer, and a super junction structure is provided by alternately arranged P and N columns that are provided by the first low concentration region and a portion of the drift layer opposing to the first low concentration region, and further comprising:

a first conductivity type or I type surrounding region disposed on an inner wall of the second trench, wherein the first low concentration region and the first high concentration region are disposed on the surrounding region.

2. A method for producing a silicon carbide semiconductor device, comprising:

providing a first or second conductivity type substrate made of silicon carbide;

forming a drift layer on the substrate, the drift layer made of a first conductivity type silicon carbide having an impurity concentration lower than that of the substrate, the drift layer including a lower layer portion and an upper layer portion, the upper layer portion being disposed above the lower layer portion and having an impurity concentration lower than that of the lower layer portion, each of the upper layer portion and lower layer portion has a uniform dopant concentration;

forming a base region on the drift layer, the base region made of a second conductivity type silicon carbide;

forming a source region in an upper layer portion of the base region, the source region made of a first conductivity type silicon carbide having an impurity concentration higher than that of the drift layer;

forming a first trench that extends from a surface of the source region to a position deeper than the base region, the trench gate structure including a gate insulation film disposed on an inner wall surface of the first trench and a gate electrode disposed on the gate insulation film;

forming a second trench that extends from the surface of the source region to the drift layer while passing through the base region and is deeper than the first trench, the second conductivity type region including a second conductivity type first low concentration region and a second conductivity type first high concentration region, the first low concentration region having a second conductivity type impurity concentration being set relatively low, the first high concentration region being disposed on a surface of the first low concentration region and having a second conductivity type impurity concentration being set higher than that of the first low concentration region, the first high concentration region being deeper than the first trench to provide a deep layer, the first low concentration region and the first high concentration region are disposed on the surrounding region;

forming a first conductivity type or I type surrounding region disposed on an inner wall of the second trench;

forming a second conductivity type region in the second trench;

forming a source electrode electrically connected to the base region through the source region and the second conductivity type region; and forming a drain electrode disposed on a rear surface of the substrate, wherein the silicon carbide semiconductor device is provided with a semiconductor switching element with an inversion type trench gate structure in which an inversion type channel region is formed on a surface portion of the base region located on a side surface of the first trench by controlling an application voltage to the gate electrode to cause an electric current between the source electrode and the drain electrode through the source region and the drift layer, and a super junction structure is provided by alternately arranged P and N columns that are provided by the first low concentration region and a portion of the drift layer opposing to the first low concentration region.

3. The method for producing the silicon carbide semiconductor device according to claim 2, wherein a region where the semiconductor switching element is formed is referred to as a cell region, and the silicon carbide semiconductor device includes an outer peripheral withstand voltage structure disposed in an outer peripheral region surrounding an outer periphery of the cell region, the method comprising:

forming a third trench in the outer peripheral region simultaneously with the forming of the second trench;

forming the first layer and the second layer in the third trench simultaneously with the forming of the first layer and the second layer in the second trench;

forming a second conductivity type second low concentration region having a second conductivity type impurity concentration equal to that of the first low concentration region and a second conductivity type second high concentration region having a second conductivity type impurity concentration higher than that of the second low concentration region and being deeper than the first trench by the first layer and the second layer left in the third trench, simultaneously with the partly removing of the first layer and the second layer to provide the first low concentration region and the first high concentration region, thereby forming an impurity embedded region; and forming a recessed portion in a region where the impurity embedded region is to be formed in the outer peripheral region to expose the drift layer in the region where the recessed portion is formed.

4. The method for producing the silicon carbide semiconductor device according to claim 3, wherein
the forming of the recessed portion is performed simultaneously with the forming of the first trench.

5. The method for producing the silicon carbide semiconductor device according to claim 2, wherein
the first layer and the second layer are formed in the second trench such that a cavity partly remains in the second trench even after the first layer and the second layer are formed, and
the source electrode is formed such that the source electrode contacts the first high concentration region provided by the second layer in the second trench.

6. The method for producing the silicon carbide semiconductor device according to claim 2
forming the second trench by performing etching through a mask having an opening at a position corresponding to a region where the second trench is to be formed in the semiconductor substrate;
forming the second conductivity type first layer and the second conductivity type second layer in the second trench, such that the first layer is formed on a bottom surface and side surfaces of the second trench and the second layer is formed on the first layer; and
partly removing the first layer and the second layer to expose the source region such that the first low concentration region and the first high concentration region are provided by the first layer and the second layer left in the second trench.

\* \* \* \* \*